(12) United States Patent
Laurila

(10) Patent No.: US 8,493,153 B2
(45) Date of Patent: Jul. 23, 2013

(54) NARROWBAND AMPLIFIER WITH IMPROVED INTERFERENCE SUPPRESSION

(75) Inventor: Hannu T. Laurila, Oulu (FI)

(73) Assignee: Nokia Corporation, Espoo (FI)

( * ) Notice: Subject to any disclaimer, the term of this patent is extended or adjusted under 35 U.S.C. 154(b) by 63 days.

(21) Appl. No.: 13/068,756

(22) Filed: May 19, 2011

(65) Prior Publication Data

US 2012/0293268 A1    Nov. 22, 2012

(51) Int. Cl.
*H03F 3/191* (2006.01)
(52) U.S. Cl.
USPC .......................................... 330/302; 330/306
(58) Field of Classification Search
USPC ................................................ 330/302, 306
See application file for complete search history.

(56) References Cited

U.S. PATENT DOCUMENTS 7,154,359 B2 * 12/2006 Inoue et al. .................... 333/193
7,675,366 B2 *  3/2010 Lin ................................ 330/302

* cited by examiner

*Primary Examiner* — Steven J Mottola
(74) *Attorney, Agent, or Firm* — Harrington & Smith

(57) ABSTRACT

A radio signal is input to a first terminal and output after amplification at a second terminal. There is a third terminal which is common to both the first and the second terminal. There is an inductance interfacing the second terminal to a direct current power supply; and a radio frequency filter connected in shunt with the inductance. In an exemplary embodiment the first, second and third terminals are respective base, collector and emitter terminals of a bipolar transistor. Such a bipolar transistor is characterized in that voltage from the power supply passes to the second terminal through the inductance but not through the radio frequency filter; and the signal output passes from the second terminal through the radio frequency filter but not through the inductance. The illustrated embodiments show the radio frequency filter as a surface acoustic wave filter in direct connection with the second terminal.

11 Claims, 8 Drawing Sheets

NARROWBAND AMPLIFIER WITH IMPROVED INTERFERENCE SUPPRESSION

TECHNICAL FIELD

The exemplary and non-limiting embodiments of this invention relate generally to low noise and power amplifier circuits such as may be used in wireless cellular, cable or television communication systems, and more specifically, relate to such circuits having a bipolar transistor and a surface acoustic wave filter.

BACKGROUND

In the wireless arts, desensitization of radio receivers caused by internal interference or noise sources is a problem in different radio technologies, such as for example global positioning system/global navigation satellite system (GPS/GNSS), digital video broadcast for handheld devices/China Mobile multimedia broadcasting (DVB-h/CMMB), broadcast FM (frequency modulation) particularly where the FM receiver has an internal antenna, and also more generally in cellular radio bands. Conventionally various filtering components have been used, as well as ferrites and parallel capacitors, to mitigate the interference. For example, one conventional arrangement for GPS is to dispose surface acoustic wave (SAW) filter at the output end of a transistor operating as a low noise amplifier (LNA). But disposing the bandpass SAW filter after the LNA is not effective in suppressing in-band intermodulation distortion (IMD) products which originate from the LNA itself.

Other sources of noise or interference is direct current DC voltage feed circuitry and a LNA collector circuit which generate internal interference signals that can easily leak to the LNA. In these instances the interference signal becomes mixed with the received signal and are subsequently amplified by the LNA, which causes degradation of the receiver sensitivity.

Mobile radio handsets also impose multiple other sources of noise/interference. In the audio system the audio power amplifier circuit and the internal hands-free IHF speaker can interfere with radio reception. In the display system the display circuitry itself, the user interface and the DC to DC converter for the display can interfere. In various video systems there may be interference from the TV output chip or from the camera. More generally, interference in a handset receiver may arise from Bluetooth or other near field communication radios, the engine hardware, the subscriber identity module (SIM) card, the micro SD (secure digital) plug and the DC plug. The FM receiver with an internal FM antenna/radiator and LNA, and also an internal mobile TV receiver, are particularly susceptible to electromagnetic interference (EMI) due to their relatively lower frequency signals, and for which the inventor is unaware of sufficiently effective solutions in the prior art.

The teachings below address the above EMI issues, but while presented in the context of mobile handset implementations the described circuitry can be employed in any number of electronic devices which employ an amplifier, whether low noise or power amplification.

SUMMARY

The foregoing and other problems are overcome, and other advantages are realized, by the use of the exemplary embodiments of this invention.

In a first aspect thereof the exemplary embodiments of this invention provide an apparatus comprising: a first terminal for a signal input; a second terminal for a signal output; a third terminal which is common to both the first and the second terminal; an inductance interfacing the second terminal to a direct current power supply; and a radio frequency filter connected in shunt with the inductance. In this embodiment the apparatus is configured to amplify the signal input.

In a second aspect thereof the exemplary embodiments of this invention provide a method comprising: interfacing a second terminal to a direct current power supply via an inductance connected in shunt with a radio frequency filter; inputting a signal at a first terminal; and amplifying the input signal and outputting the amplified signal at a second terminal. In this second aspect the first terminal and the second terminal have a third terminal in common.

In a third aspect thereof the exemplary embodiments of the invention provide a circuit comprising: a bipolar junction transistor defining a base, a collector and an emitter; a radiofrequency filter; and an inductance in parallel with the radiofrequency filter. The collector interfaces to a direct current power supply via the parallel inductance and radiofrequency filter; and the collector further interfaces to either a radio receiver or a transmit antenna via the parallel inductance and radiofrequency filter These and other aspects are more particularly detailed below.

DETAILED DESCRIPTION

Typically the LNA is a wideband component, amplifying signals over a wide frequency range. In the example noted in background above, it is known in GPS/GNSS applications to dispose a SAW filter before and after an external LNA to attenuate unwanted signals. This wideband characteristic has proved to be an insight into the solution for mitigating interference at an LNA.

Figure 6:
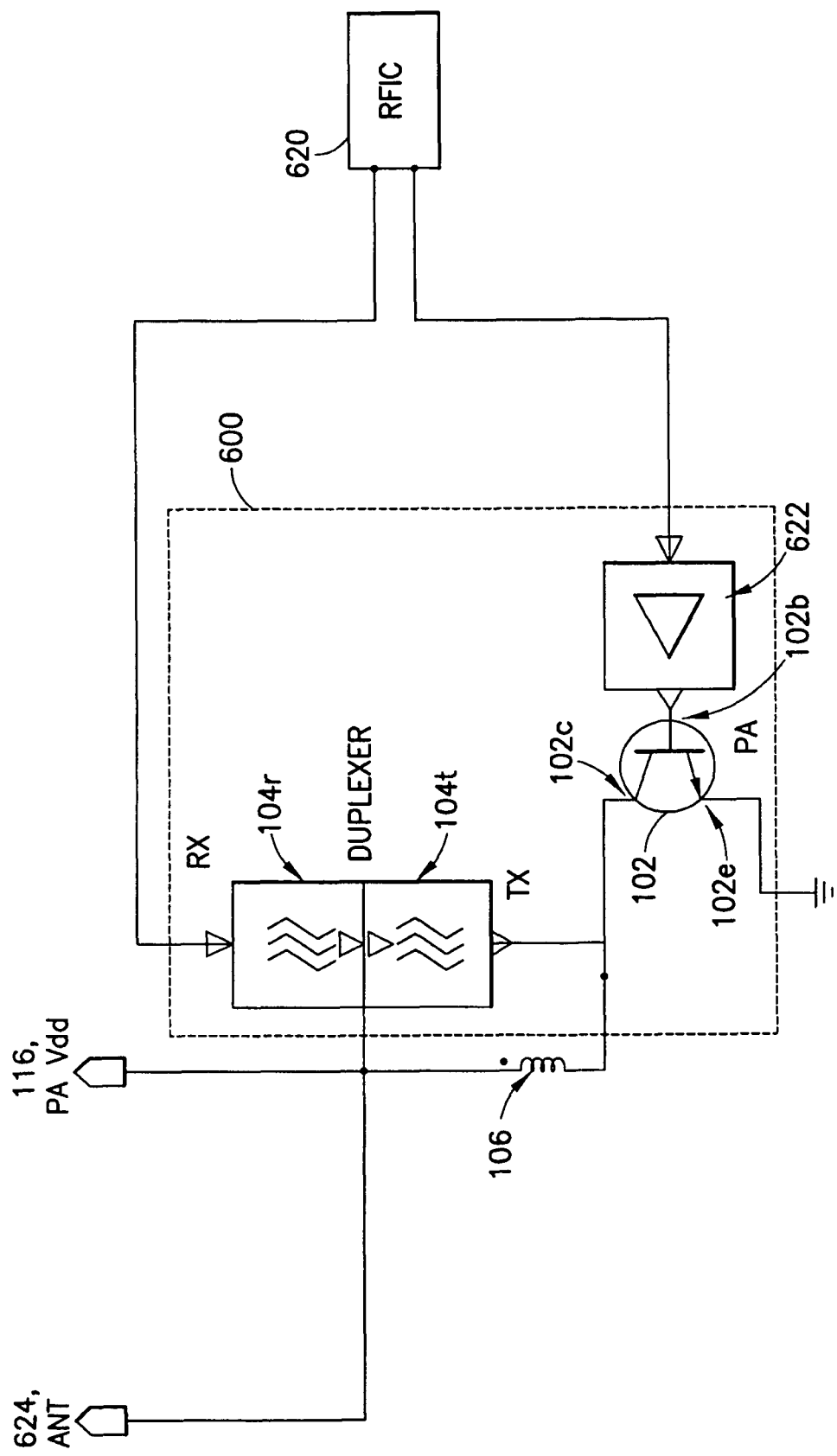
FIG. 6 is a circuit diagram illustrating a power amplifier circuit 600 according to a second embodiment of the invention.

According to an exemplary embodiment of these teachings, instead of disposing the SAW filter at the output of a bipolar transistor, disposing it at the collector changes the overall circuit characteristic so that the LNA exhibits a narrowband response at its output rather than a wideband response. The narrowband is defined by the passband of the SAW filter, as will be seen at FIGS. 2 (gain) and 5 (noise factor). In prior art approaches in which the SAW is external of the LNA circuit the LNA exhibits a wideband response in that it does not clip the input signal frequency-wise. The result of placing the SAW filter at the output of the bipolar transistor within the LNA circuit according to these embodiments is that leakage of internal interference signals to the LNA are suppressed at the same time the now narrowband response of the LNA amplifies only the desired frequency band rather than a larger band which includes some noise that is not otherwise suppressed. Example circuit topologies for implementing this concept in a radio environment are illustrated at FIGS. 1 and 6 below.

Figure 1:
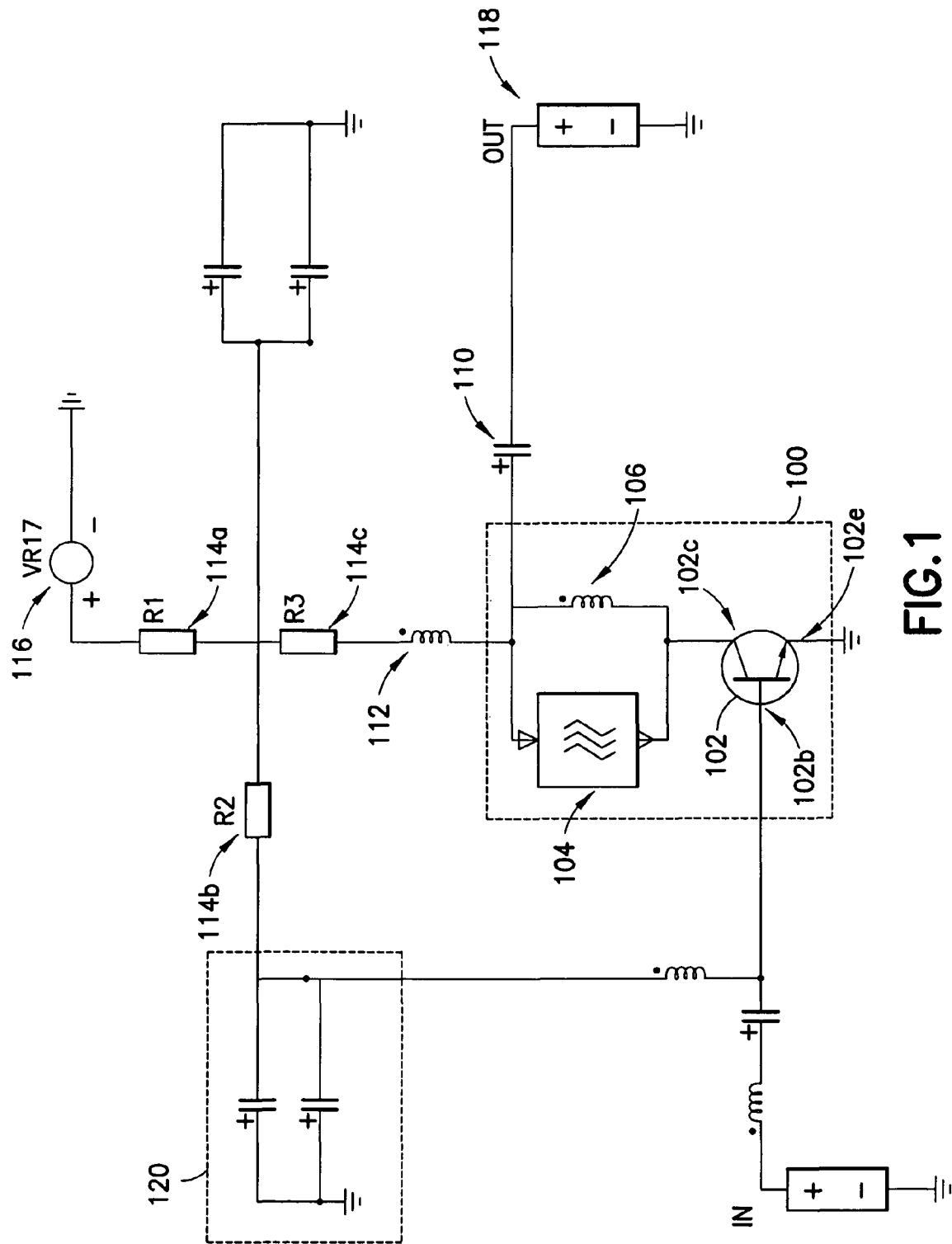
FIG. 1 is a circuit diagram illustrating an amplifier circuit 100 according to a first embodiment of the invention in relation to a radio receiver and a DC power supply.

FIG. 1 is a circuit diagram illustrating a first embodiment of the LNA circuit 100 in relation to a radio receiver 120 and a DC power supply or source 116 such as a galvanic battery, a fuel cell, or the output of a DC to DC converter; to name a few non-limiting embodiments. The circuit includes a transistor 102 having a first terminal 102b for signal input from the radio receiver 120, a second terminal 102c for signal output from the transistor 102, and a third terminal 102e that is common to both the first terminal 102b and the second terminal 102c. Where the transistor 102 is a bipolar transistor as illustrated, the respective first, second and third terminals are the base, collector and emitter. Both embodiments detailed herein are also similarly useful when assembled with a field effect transistor FET rather than the bipolar junction transistor illustrated. Similarly, both embodiments are also useful when the LNA is a differential LNA which multiplies the difference between its two inputs by a constant differential gain; and/or when a bulk acoustic wave BAW filter is used in place of the illustrated SAW filter. FIG. 1 illustrates a NPN bipolar junction transistor for the non-limiting first embodiment. Within the LNA circuit 100 is also a radio frequency (RF) filter 104 which couples the second terminal 102c to the direct current power supply 116, and an inductor 106 connected in shunt with the RF filter 104. At FIG. 1 the RF filter is implemented as a SAW filter. While a discrete inductor 106 is illustrated, more generally an inductance may be imposed where shown.

Further at FIG. 1 there is a second inductor 112 and a capacitor 110 which are output-matched to the LNA circuit 100. Similar to the inductance above, a capacitance may be implemented instead of a discrete capacitor 110 which FIG. 1 illustrates. The second inductor 112 interfaces the DC power supply 116 to the collector 102c via the parallel RF filter 104 and first inductor 106. Three bias resistors 114a, 114b, 114c assure current/signal flow in the intended direction from the receiver 120 and the LNA circuit 100 toward an output 118 of the LNA circuit 100. In a mobile handset implementation that output 118 may be considered to be an input to a digital signal processor for demodulation, sampling and detection.

The SAW filter 104 is disposed in the LNA's collector circuit (which includes the SAW filter 104 and the second/matched inductor 112), between the collector 102c and the voltage source 116. This changes the characteristic of the amplified output signal to be narrowband at the collector 102c in accordance with the RF bandpass limits of the SAW filter 104, rather than wideband (unclipped) as would be the case if the filter 104 were at the emitter 102e. At the same time, the LNA bias and operating point remains unchanged. The parallel inductor 106 enables DC access to the LNA collector 102c. In an alternative embodiment that inductor 106 may instead be replaced by a ferrite coil or other ferrite component as the inductance. The collector SAW 104 and its parallel inductor 106 effectively filter the internally generated interference and noise signals coming from the DC feed 116 to the bipolar transistor 102.

Disposing the SAW filter 104 in parallel with a large capacity inductor 106 in the collector circuit (104 and 112) allows the SAW filter to pass only signals within the desired narrow passband, so the collector's RF signal is limited only to that passband. The DC signal from the power supply 116 does not pass through the SAW filter 104, so it is the parallel inductor 104 that enables the Vcc (transistor voltage) feed and DC bias for the LNA transistor 102. The RF signal from the receiver 120 does not pass this large value inductor 106, only through the SAW filter 104 toward the LNA output/digital signal processor 118. Similarly the DC bias passes only through the inductor 106 toward the collector 102c. Thus the inductor 106 is configured (by its disposition in the circuit 100 and its farad rating) to pass voltage from the power supply 116 to the collector terminal 102c and also to block the signal output from the collector terminal 102c. Similarly the RF/SAW filter 104 is configured (by its disposition in the circuit 100 and its bandpass characteristics) to pass the signal output from the collector terminal 102c and also to block voltage from the power supply 116 to the collector terminal 102c. The combination of SAW filter 104 and inductor 106 in parallel therefore provides good interference filtering at the LNA's DC feed circuit (which includes the large value inductor 104 and the matched capacitor 110; the SAW filter 104 may be considered part of the DC feed circuit but recognizing that no DC bias passes through it).

Conventionally for a GPS implementation the relevant circuitry would eliminate the high value inductor 106 from FIG. 1 and move the SAW filter 104 in series between the battery 116 and the second inductor 112. But this allows internally generated interference to leak to the transistor's collector 102c via the DC feed circuit. Once at the collector 102c this interference is mixed into the desired frequency band and amplified, making it quite difficult to separate from the wanted signal after the mixing. This is because the LNA conventionally has a high gain across a large frequency band, but quite low interference suppression performance.

Figure 2:
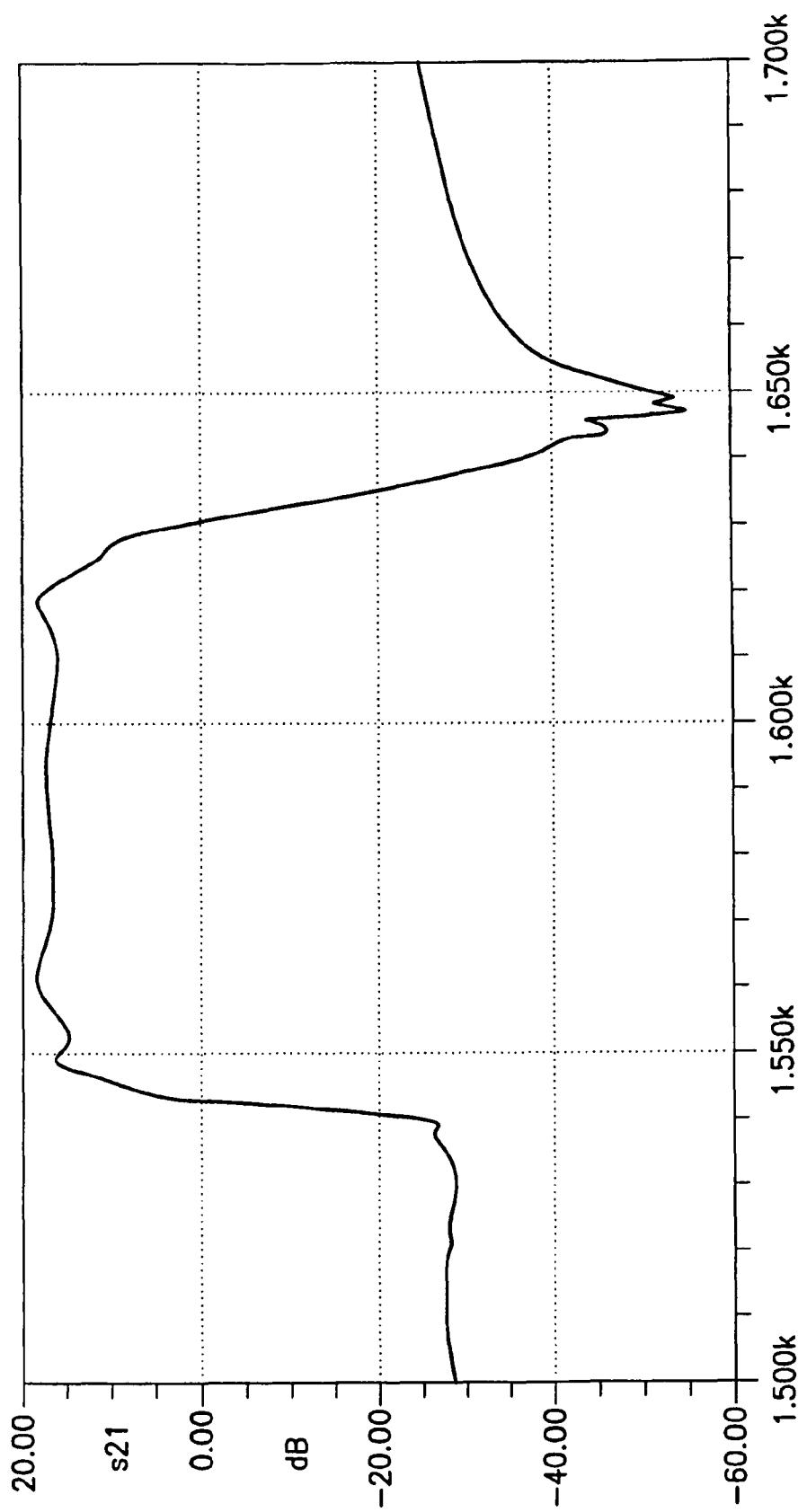
FIG. 2 is gain chart (gain versus frequency) at the collector of the circuit of FIG. 1.
Figure 3:
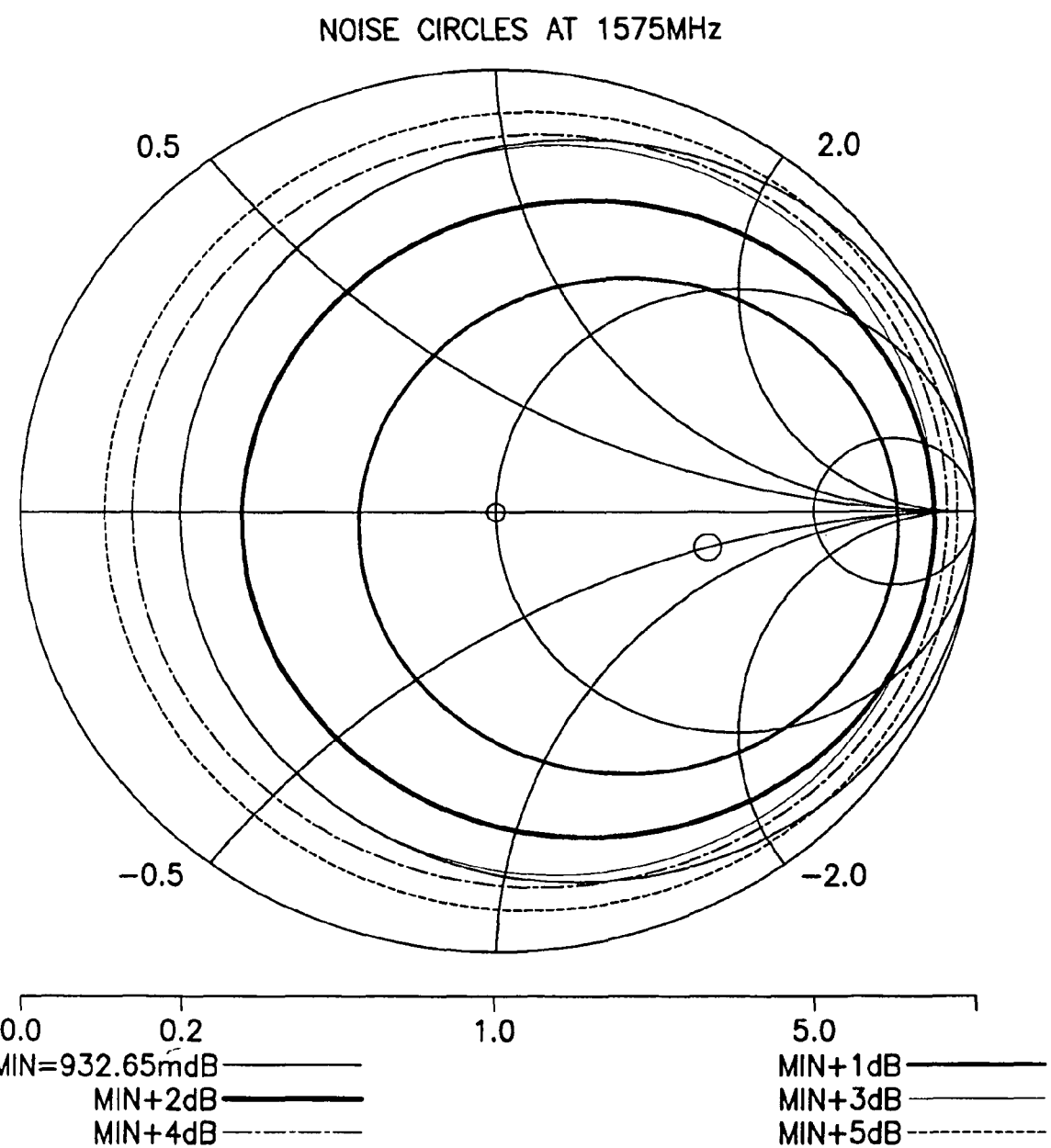
FIGS. 3-4 are Smith charts for the circuit of FIG. 1.
Figure 4:
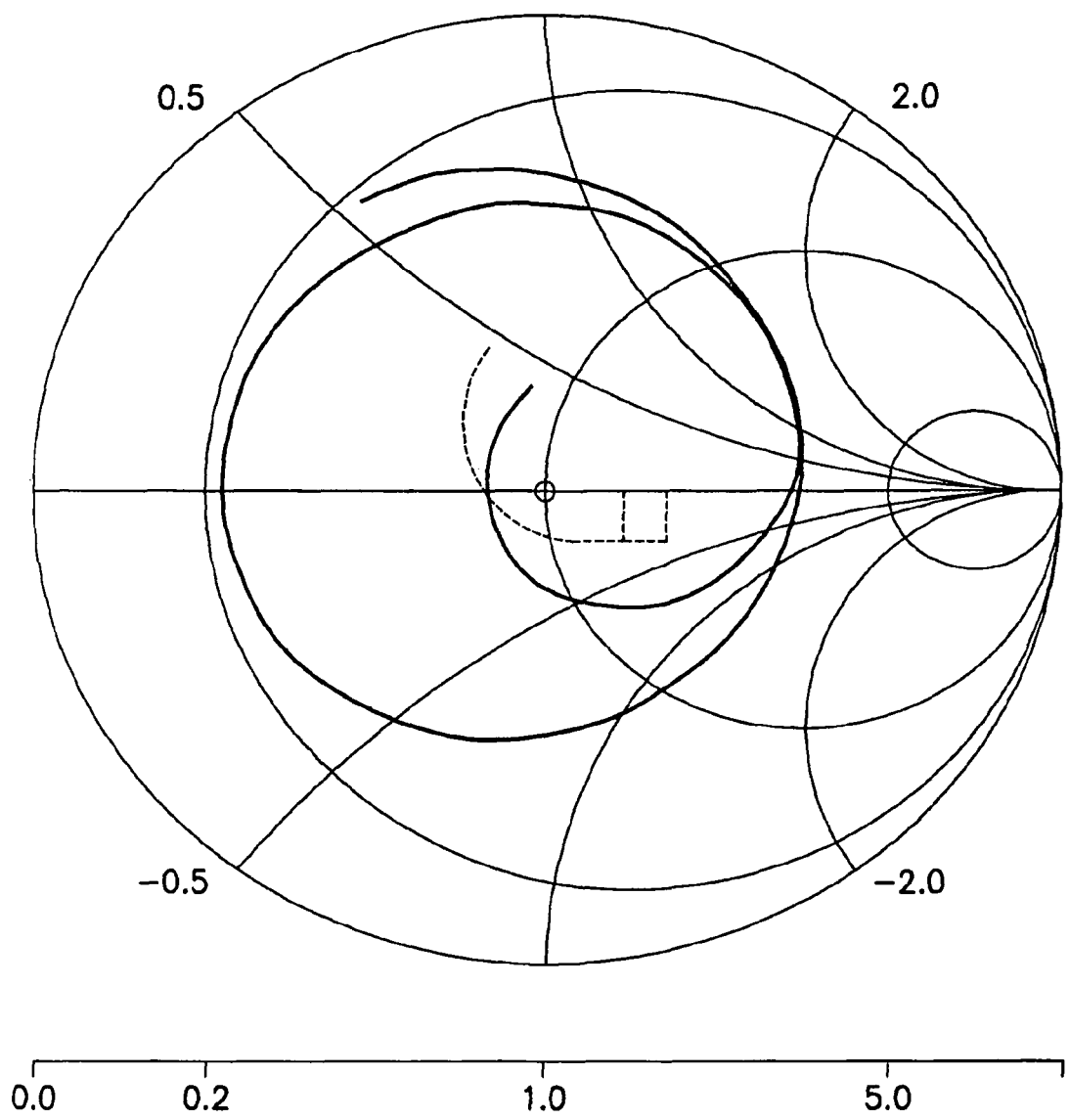

FIGS. 2-5 illustrate characteristics of the FIG. 1 circuit as particularly adapted for use in a mobile handset to suppress noise in the GPS band, using values 47 nH for the first inductor 106 and 100 pF for the capacitor 110. These values are non-limiting; other (sufficiently large) values may be selected without affecting the passband response, and acceptable values may also depend on the most severe EMI frequencies to be suppressed. Additionally, the 100 pF capacitor 110 was chosen to match the DC block 116, but smaller values may be appropriate where it is also used for RF matching. FIG. 2 is a graph showing gain versus frequency at the collector 102c of the LNA 102 in combination with the SAW filter 104. Gain slopes are reasonably steep at the SAW filter's bandpass limits 1540 MHz (megahertz) and 1630 MHz and relatively constant within those bounds. FIG. 3 is a Smith chart showing noise circles at 1575 MHz. FIG. 4 plots input impedance as S11 and output impedance as S22.

Figure 5:
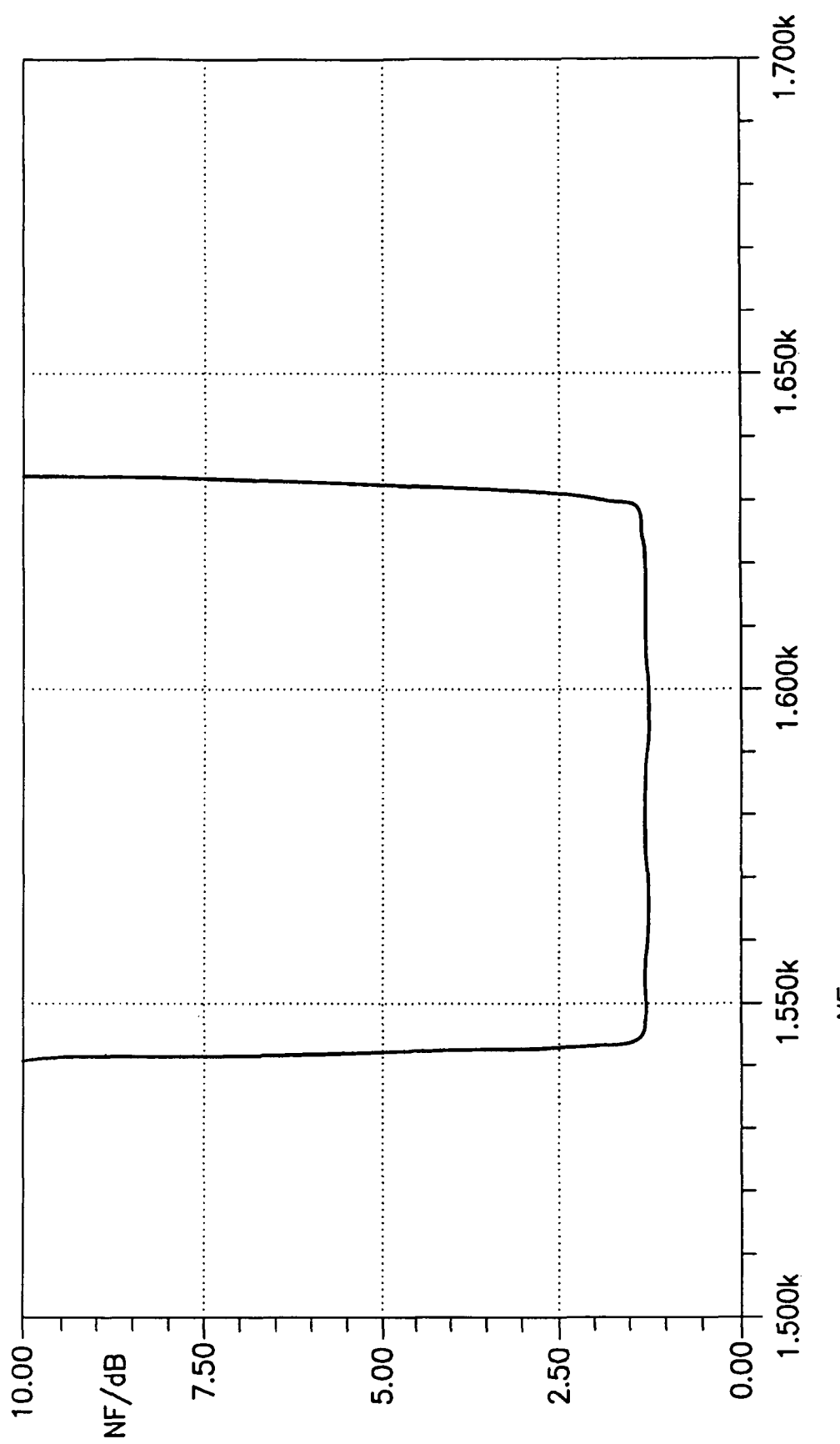
FIG. 5 is a noise figure chart (versus frequency) for the circuit of FIG. 1.

FIG. 5 graphs noise figure NF of the FIG. 1 amplifier circuit 100 at various frequencies. The dramatically steep skirts at the RF bandpass boundaries illustrate just how effective is the FIG. 1 circuit at attenuating noise outside the desired band, even if internally generated by the DC circuit. Whereas conventional solutions such as that for GPS noted in background above would amplify across a wide frequency band (and for example mix EMI arising from the battery circuit with the desired GPS signal), FIG. 5 shows that noise outside the passband defined by the SAW filter 104 is quite effectively suppressed regardless of whether that noise is generated internally.

FIG. 2 also shows that there is gain at the SAW filter passband and attenuation elsewhere. Together with FIG. 5, embodiments of the invention provide that in the frequency band over which there is gain (the SAW filter passband) the noise figure is small but at frequencies outside that band attenuation and noise figure are both high.

FIG. 6 is a circuit diagram illustrating a second embodiment, a power amplification circuit. In this embodiment there is a RF integrated circuit (RFIC) 620 providing a receiver along the top and a transmitter along the bottom of FIG. 7, with power amplification along the transmit path. A power amplifier 622 feeds the first/base terminal of the bipolar transistor 102, which like FIG. 1 has its second/collector terminal 102c interfacing a SAW filter 104t and its third/emitter terminal 102e coupled to ground. The relevant SAW filter 104t of FIG. 6 forms part of a SAW duplexer 104r/104t with a SAW filter on both receive (104r) and transmit (104t) pathways. The SAW duplexer allows interference suppression along both the transmit and receive pathways to be conveniently implemented using the teachings related to FIG. 6 and FIG. 1, respectively.

In this case the DC power supply 116 provides the positive transistor voltage Vdd and as can be seen the first SAW filter 104t is in parallel with a large value inductor 106 and disposed between the DC power supply 116 and the collector 102c. DC bias flows to the collector 102c through the inductor 106 but not through the first SAW filter 104t, and the RF signal for transmission via the transmit antenna 624 passes through the first SAW filter 104t but not through the shunted inductor 106, similar to the received RF signal at FIG. 1.

Whether for LNA or power amplification, putting the SAW filter 104 in parallel with a large value inductor (FIGS. 1 and 6) at the collector terminal suppresses leakage of internally generated interference signals to the bipolar transistor/LNA 102 and results in a bandpass type frequency response, while at the same time enabling the LNA to amplify only the desired passband frequencies.

Embodiments of the invention as detailed above by example may be advantageously disposed in a mobile radio handset/terminal, more generally known as a user equipment UE. Various embodiments of such a UE 10 can include, but are not limited to, cellular telephones, personal digital assistants (PDAs) having wireless communication capabilities, portable computers having wireless communication capabilities, image capture devices such as digital cameras having wireless communication capabilities, gaming devices having wireless communication capabilities, music storage and playback appliances having wireless communication capabilities, Internet appliances permitting wireless Internet access and browsing, as well as portable units or terminals that incorporate combinations of such functions.

Figure 7:
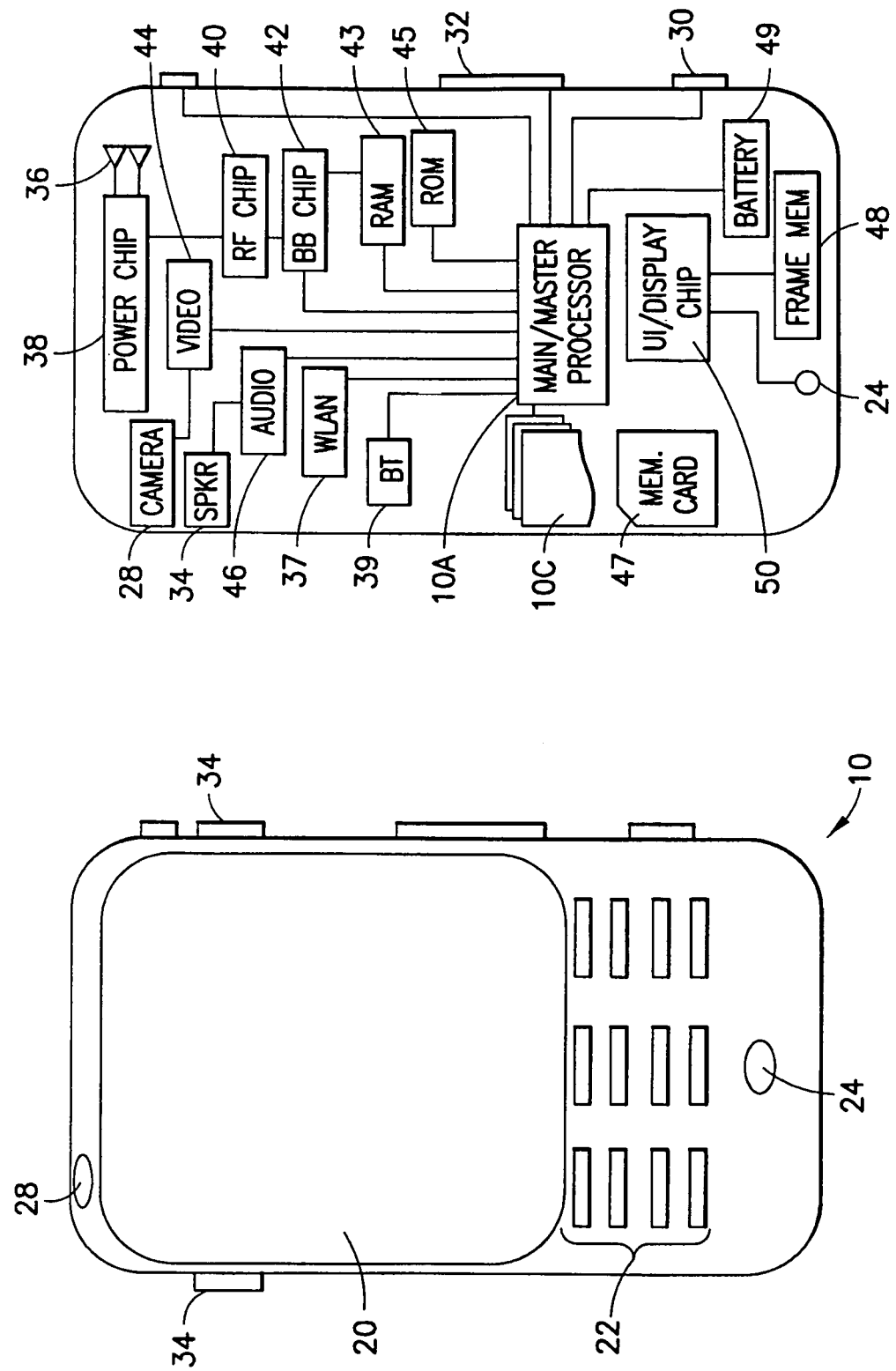
FIG. 7 is a diagram of a mobile radio terminal/user equipment in which embodiments of the invention may be advantageously employed.

FIG. 7 illustrates schematically some relevant functional blocks of an exemplary mobile radio terminal/UE in both plan view (left) and sectional view (right), and the invention may be embodied in one or some combination of those more function-specific components. At FIG. 7 the UE 10 has a graphical display interface 20 and a user interface 22 illustrated as a keypad but understood as also encompassing touch-screen technology at the graphical display interface 20 and voice-recognition technology received at the microphone 24. The exemplary UE 10 may have a camera 28 which is shown as being forward facing (e.g., for video calls) but may alternatively or additionally be rearward facing (e.g., for capturing images and video for local storage), and also has a microphone 24 and one or more handsfree speakers 34.

Within the sectional view of FIG. 7 are seen multiple transmit/receive antennas 36 that are typically used for cellular communication. The antennas 36 may be disposed on a printed wiring board on which a power chip 38 is formed. The FIG. 6 implementation may be embodied at the power chip 38 which controls power amplification on the channels being transmitted and/or across the antennas that transmit simultaneously where spatial diversity is used. The FIG. 1 implementation may also be at the power chip 38 which additionally outputs the amplified received signal to the radio-frequency (RF) chip 40 which demodulates and downconverts the signal for baseband processing. The baseband (BB) chip 42 detects the signal which is then converted to a bit-stream and finally decoded. Similar processing occurs in reverse for signals generated in the apparatus 10 and transmitted from it.

Signals to and from the camera 28 pass through an image/video processor 44 which encodes and decodes the various image frames. A separate audio processor 46 may also be present controlling signals to and from the speakers 34 and the microphone 24. The graphical display interface 20 is refreshed from a frame memory 48 as controlled by a user interface chip 50 which may process signals to and from the display interface 20 and/or additionally process user inputs from the keypad 22 and elsewhere. All of these are potential sources of EMI for the radio signals.

Certain embodiments of the UE 10 may also include one or more secondary radios such as a wireless local area network radio WLAN 37 and a Bluetooth® radio 39, which may incorporate an antenna on-chip or be coupled to an off-chip antenna. These also may be EMI sources. Throughout the apparatus are various memories such as random access memory RAM 43, read only memory ROM 45, and in some embodiments removable memory such as the illustrated memory card 47 on which the various programs 10C are stored. All of these components within the UE 10 are normally powered by a portable power supply such as a battery 49, shown at FIGS. 1 and 6 as the DC power supply.

Note that the various chips (e.g., 38, 40, 42, etc.) that were described above may be combined into a fewer number than described and, in a most compact case, may all be embodied physically within a single chip. Embodiments of the invention may be disposed at one or several of these chips, most particularly an RF front end chip represented in general as the power chip 38 or RF chip 40.

Figure 8:
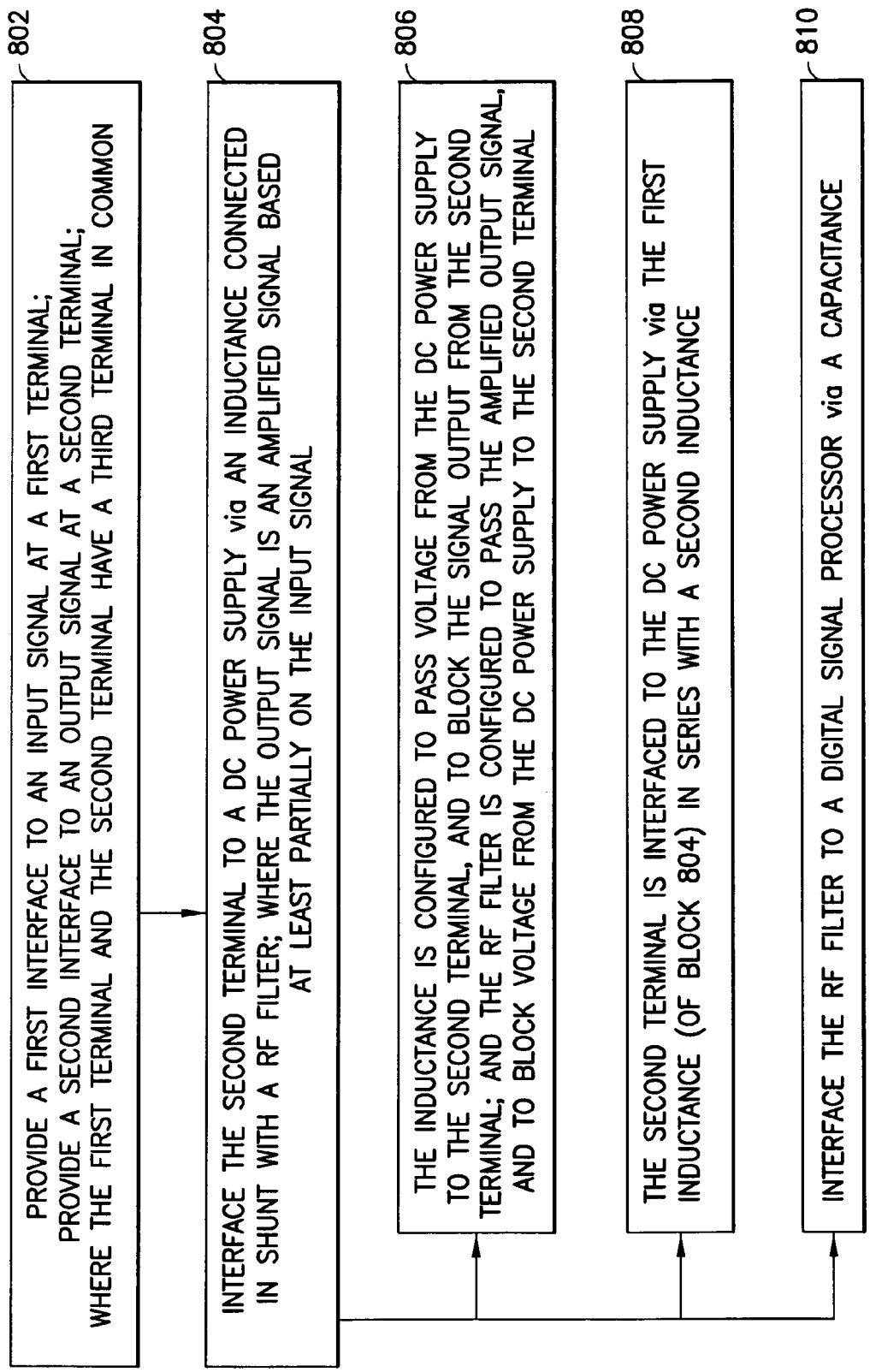
FIG. 8 is a logical flow diagram illustrating a method for making a circuit according to an exemplary embodiment of these teachings.

FIG. 8 is a logical flow diagram illustrating a method for making a circuit according to these teachings, such as but not limited to the circuits illustrated at FIGS. 1 and 6. Parenthetical reference numbers referring to FIGS. 1 and 6 are therefore exemplary but not limiting.

At block 802 there is provided a first interface (the terminal electrical lead) to an input signal at a first terminal (102b), and a second interface (the terminal electrical lead) to an output signal at a second terminal (102c). The first terminal and the second terminal have a third terminal (192e) in common. At block 804 the second terminal is interfaced to a direct current power supply (116) via an inductance (106) connected in shunt with a radio frequency filter (104). This output signal is characterized in that it is an amplified signal based at least partially on the input signal.

By non-limiting example the first, second and third terminals are terminals of a bipolar transistor (102) or a field effect transistor; and/or the RF filter is a SAW filter (104) in direct connection with the second terminal; and/or the input signal may be a received radio signal (from radio receiver 120) or a signal for transmission (from RFIC 620) which is output from a power amplifier (622) to the first terminal.

Further elements of FIG. 8 are optional and may be employed with blocks 802 and 804 individually or in various combinations. At block 806 the inductance is characterized in that it is configured to pass voltage from the DC power supply to the second terminal and to block the signal output from the second terminal; and the RF filter is characterized in that it is configured to pass the amplified output signal and to block voltage from the DC power supply to the second terminal. If we consider the inductance of block 804 as a first inductance, then at block 808 the second terminal is interfaced to the DC power supply via the first inductance (106) in series with a second inductance (112). And at block 810 a digital signal processor (118) is interfaced to the RF filter of block 804 via a capacitance (110).

The various blocks shown in FIG. 8 may be viewed as method steps, and/or as operations that result from operation of computer program code controlling machinery to make and/or implement a circuit according to these teachings, and/or as a plurality of coupled logic circuit elements constructed to carry out the associated function(s).

It should thus be appreciated that at least some aspects of the exemplary embodiments of the inventions may be practiced in various components such as integrated circuit chips and modules, and that the exemplary embodiments of this invention may be realized in an apparatus that is embodied as an integrated circuit.

Various modifications and adaptations to the foregoing exemplary embodiments of this invention may become apparent to those skilled in the relevant arts in view of the foregoing description, when read in conjunction with the accompanying drawings. However, any and all modifications will still fall within the scope of the non-limiting and exemplary embodiments of this invention.

What is claimed is:

1. An apparatus comprising:
   a first terminal for a signal input, in which the signal input comprises a radio signal;
   a second terminal for a signal output;
   a third terminal which is common to both the first and the second terminal;
   an inductance interfacing the second terminal to a direct current power supply, wherein the inductance is a first inductance, the apparatus further comprising a second inductance disposed in series between the direct current power supply and the first inductance;
   a radio frequency filter connected in shunt with the first inductance; and
   a capacitance interfacing the radiofrequency filter to a digital signal processor, wherein the apparatus is configured to amplify the signal input.

2. The apparatus according to claim 1, in which the first, second and third terminals are terminals of a bipolar transistor;
   characterized in that the first inductance is configured to pass voltage from the power supply to the second terminal and to block the signal output from the second terminal; and the radio frequency filter is configured to pass the signal output from the second terminal and to block voltage from the power supply to the second terminal.

3. The apparatus according to claim 2, in which the radio frequency filter comprises a surface acoustic wave filter in direct connection with the second terminal.

4. The apparatus according to claim 1, further comprising a power amplifier interfacing to the first terminal.

5. The apparatus according to claim 4, in which the first, second and third terminals are terminals of a bipolar transistor; and the signal input comprises a radio signal for transmission.

6. A method comprising:
   providing a first interface to an input signal at a first terminal, wherein the input signal comprises a radio signal;
   providing a second interface to an output signal at a second terminal;
   interfacing the second terminal to a direct current power supply via an inductance connected in shunt with a radio frequency filter, wherein the inductance is a first inductance;
   disposing a second inductance between the direct current power supply and the first inductance; and
   interfacing the radiofrequency filter to a digital signal processor via a capacitance, wherein the output signal is an amplified signal based at least partially on the input signal, and the first terminal and the second terminal have a third terminal in common.

7. The method according to claim 6, in which the first, second and third terminals are terminals of a bipolar transistor or a field effect transistor;
   characterized in that the first inductance is configured to pass voltage from the direct current power supply to the second terminal and to block the signal output from the second terminal; and
   the radio frequency filter is configured to pass the amplified output signal and to block voltage from the direct current power supply to the second terminal.

8. The method according to claim 7, in which the radio frequency filter comprises a surface acoustic wave filter in direct connection with the second terminal.

9. The method according to claim 6, in which the input signal is output from a power amplifier to the first terminal.

10. The method according to claim 9, in which the first, second and third terminals are terminals of a bipolar transistor; and the input signal comprises a radio signal for transmission.

11. The apparatus according to claim 1, disposed in a mobile radio terminal.

* * * * *